US012573738B2

(12) United States Patent
Godshalk

(10) Patent No.: US 12,573,738 B2
(45) Date of Patent: Mar. 10, 2026

(54) RADIO FREQUENCY PROBE INCLUDING A DIELECTRIC WAVEGUIDE AND A CONDUCTING TRANSITION MEMBER HAVING AN END PORTION WITH ASSOCIATED PRONGS

(71) Applicant: Redpoint Microwave, LLC, Newberg, OR (US)

(72) Inventor: Edward M. Godshalk, Newberg, OR (US)

(73) Assignee: Redpoint Microwave, LLC, Newberg, OR (US)

( * ) Notice: Subject to any disclaimer, the term of this patent is extended or adjusted under 35 U.S.C. 154(b) by 0 days.

(21) Appl. No.: 19/233,271

(22) Filed: Jun. 10, 2025

(65) Prior Publication Data

US 2025/0379349 A1    Dec. 11, 2025

Related U.S. Application Data

(60) Provisional application No. 63/658,241, filed on Jun. 10, 2024, provisional application No. 63/820,198, filed on Jun. 9, 2025.

(51) Int. Cl.
  *H01P 5/08*     (2006.01)
  *G01R 1/067*     (2006.01)
  (Continued)

(52) U.S. Cl.
  CPC .......... *H01P 5/087* (2013.01); *G01R 1/06772* (2013.01); *H01P 3/121* (2013.01); *H01P 3/16* (2013.01); *H01P 5/1022* (2013.01)

(58) Field of Classification Search
  CPC .......... H01P 5/087; H01P 3/16; H01P 5/1022; G01R 1/06772
  (Continued)

(56) References Cited

U.S. PATENT DOCUMENTS 2,829,348 A    4/1958  Kostriza et al.
4,463,329 A    7/1984  Suzuki
  (Continued)

FOREIGN PATENT DOCUMENTS

CN    205566780 U    9/2016
CN    111755793 A    10/2020
  (Continued)

OTHER PUBLICATIONS

Yong et al., An Overview of Recent Development of the Gap-Waveguide Technology for mmWave and Sub-THz Applications, IEEE Access, vol. 11, Jul. 10, 2023, 23 pages.
  (Continued)

*Primary Examiner* — Benny T Lee
(74) *Attorney, Agent, or Firm* — Chernoff, Vilhauer LLP

(57) ABSTRACT

Radio frequency (RF) probes are shown and disclosed. In some embodiments, the RF probe includes a dielectric waveguide having opposed first and second longitudinal end portions and a planar conducting ground member being received in the first end portion of the dielectric waveguide. The conducting ground member includes an end portion with at least a first prong. The probe assembly additionally includes a conducting transition member received in the first end portion of the dielectric waveguide and spaced from the planar conducting ground member. The conducting transition member includes an end portion that includes a second prong spaced from the first prong.

20 Claims, 16 Drawing Sheets

(51) Int. Cl.
    *H01P 3/12*     (2006.01)
    *H01P 3/16*     (2006.01)
    *H01P 5/10*     (2006.01)
(58) Field of Classification Search
    USPC ........................................................ 333/248
    See application file for complete search history.

(56) References Cited

U.S. PATENT DOCUMENTS

| | | | |
|---|---|---|---|
| 4,697,143 A | 9/1987 | Lockwood et al. | |
| 4,785,268 A | 11/1988 | Walter et al. | |
| 4,875,026 A | 10/1989 | Walter et al. | |
| 4,992,762 A | 2/1991 | Godshalk et al. | |
| 5,506,515 A * | 4/1996 | Godshalk et al. | G01R 1/06772 |
| | | | 324/755.02 |
| 5,565,788 A | 10/1996 | Burr et al. | |
| 5,910,754 A | 6/1999 | Simpson et al. | |
| 7,876,114 B2 | 1/2011 | Campbell et al. | |
| 9,472,840 B2 | 10/2016 | Herbsommer et al. | |
| 9,620,841 B2 | 4/2017 | Tong et al. | |
| 9,666,921 B2 | 5/2017 | Rogozine et al. | |
| 9,692,102 B2 * | 6/2017 | Herbsommer et al. ...................... | |
| | | | H01P 5/087 |
| 9,979,062 B2 | 5/2018 | Deriso | |
| 10,658,723 B1 | 5/2020 | Kho et al. | |
| 10,879,577 B2 | 12/2020 | Capet et al. | |
| 10,985,468 B2 | 4/2021 | Baldauf et al. | |
| 11,410,829 B1 | 8/2022 | Jing et al. | |
| 11,495,871 B2 | 11/2022 | Vosoogh et al. | |
| 11,978,943 B2 | 5/2024 | Doty | |
| 12,057,613 B2 | 8/2024 | Krueger | |
| 2009/0189623 A1 | 7/2009 | Campbell et al. | |
| 2013/0106456 A1 | 5/2013 | Weike, II et al. | |
| 2016/0164189 A1 | 6/2016 | Jafarlou et al. | |
| 2017/0040659 A1 | 2/2017 | Morgan et al. | |
| 2018/0045769 A1 | 2/2018 | Rettig | |
| 2019/0097294 A1 * | 3/2019 | Rusch et al. .............. | H01P 3/16 |
| 2020/0036074 A1 | 1/2020 | Yoshimoto et al. | |
| 2021/0285985 A1 * | 9/2021 | Zhu et al. .......... | G01R 1/06755 |
| 2024/0012024 A1 * | 1/2024 | Carpintero Del Barrio et al. ....... | |
| | | | G01R 1/071 |
| 2024/0111088 A1 | 4/2024 | Bian et al. | |

FOREIGN PATENT DOCUMENTS

| | | |
|---|---|---|
| CN | 112909474 A | 6/2021 |
| CN | 113169433 A | 7/2021 |
| CN | 110731029 A | 8/2022 |
| DE | 102015221142 A1 | 5/2016 |
| EP | 0221172 A | 5/1987 |
| EP | 1331688 A1 | 7/2003 |
| EP | 2500978 B1 | 10/2013 |
| EP | 3143665 B1 | 7/2021 |
| EP | 4210164 A1 | 12/2023 |
| JP | H04155261 A | 5/1992 |
| JP | 2008241711 A | 10/2008 |

OTHER PUBLICATIONS

Yalamanchili et al., Rectangular waveguides with two conventional and two superconducting walls, Int. Electronics vol. 78, No. 4, Oct. 27, 1994, 16 pages.
Godshalk, A V-Band Wafer Probe Using Ridge-Trough Waveguide, IEEE Transactions Microwave Theory and Techniques, vol. 39, No. 12, Dec. 1991, 11 pages.
Reck et al., Micromachined Probes for Submillimeter-Wave on Wafer Measurements Part I Mechanical Design and Characterization Part 1, IEEE Transactions on Terahertz Science and Technology, vol. 1, No. 2, Nov. 2011, 8 pages.
Reck et al., Micromachined Probes for Submillimeter-Wave On-Wafer Measurements Part II RF Design and Characterization, IEEE Transactions on Terahertz Science and Technology, vol. 1, No. 2, Nov. 2011, 7 pages.
Whinnery et al., Equivalent Circuits for Discontinuities in Transmission Lines, Proceedings of the I.R.E., Feb. 1, 1944, 17 pages.
Cohn, Properties of Ridge Waveguide, Proceedings of the I.R.E., Aug. 31, 1947, 6 pages.
Cohn, Optimum Design of Stepped Transmission-Line Transformers, I.R.E. Transactions—Microwave Theory and Techniques, vol. 3, Issue 3, Apr. 30, 1955, 6 pages.
Hopfer, The Design of Ridged Waveguides, I.R.E. Transactions—Microwave Theory and Techniques, vol. 3, Issue 5, Oct. 31, 1955, 10 pages.
Ponchak, A New Rectangular Waveguide to Planar Waveguide Transition, Case Western Reserve University, NASA Lewis Research Center, Cleveland, Ohio, May 1990, 2 pages.
Samir, CPW Excitation Using a Contactless Dielectric Waveguide Probe for the V-Band, Centre for Intelligent Antenna and Radio Systems (CIARS), Electrical and Computer Engineering, University of Waterloo, CA, Jan. 2021, 4 pages.
Marcatili, Dielectric Rectangular Waveguide and Directional Coupler for Integrated Optics, The Bell System Technical Journal, vol. 48, Issue: 7, Nokia Bell Labs, Sep. 1969, 32 pages.
Marcatili, Bends in Optical Dielectric Guides, The Bell System Technical Journal, vol. 48, Issue: 7, Nokia Bell Labs, Sep. 1969, 32 pages, 30 pages.
Goell, A circular-harmonic computer analysis of rectangular dielectric waveguides, The Bell System Technical Journal, vol. 48, Issue: 7, Nokia Bell Labs, Sep. 1969, 28 pages.
Itoh et al., Analysis of Modes in a Finite Width Parallel Plate Waveguide, University of Illinois, Urbana IL, Apr. 1976, 26 pages.
Wen, Coplanar Waveguide: A Surface Strip Transmission Line Suitable for Nonreciprocal Gyromagnetic Device Applications, IEEE Transactions on Microwave Theory and Techniques, vol. 17, Issue 12, Dec. 1969, 4 pages.
Bates et al., Nonradiative Dielectric Waveguide Millimetre-wave Integrated Circuits—A Review, Department of Defence, Defence Science and Technology Organisation, Salisbury, Electronics Research Laboratory, South Australia, Jun. 1990, 29 pages.
Bruno et al., Powder Core Dielectric Channel Waveguide, IEEE Transactions on Microwave Theory and Techniques vol. 42, Issue: 8, Aug. 1994, 9 pages.
Weinzierl et al., Dielectric Waveguides at Submillimeter Wavelenghts, 1998 IEEE Sixth International Conference on Terahertz Electronics Proceedings, Sep. 1998, 4 pages.
Hoffman et al. Flexible Low-Loss Dielectric Waveguides for THz Frequencies with Transitions to Metal Waveguides, Proceedings of the 33rd European Microwave Conference, Munich IEEE Computer Society, 2003, 4 pages.
Westerveld et al., Extension of Marcatili's analytical approach for rectangular silicon optical waveguides, The Journal of Lightwave Technology, vol. 30, No. 14, Jul. 15, 2012, 14 pages.
Song et al., E-Tube dielectric waveguide cable for high-speed communication, www.nature.com/scientificreports, Oct. 26, 2020, 8 pages.
Ding et al., Design and Analysis of a Mode Coupler Based Multimode Multidrop Si Dielectric Waveguide Channel for Sub-THz/THz Interconnect, IEEE Transactions on Microwave Theory and Techniques, Jul. 2023, 14 pages.
Next Generation Waveguide Technology, Samtec Waveguide eBrochure, Samtec Inc. Jul. 2023, 2 pages.
Khanal, Measurement of Dielectric Properties at 75-325 GHz using a Vector Network Analyzer and Full Wave Simulator, Dept. of Radio Science and Engineering, Aalto University School of Electrical Engineering, Aalto, Finland Radioengineering, vol. 21, No. 2, Jun. 2012, 7 pages.
Meyer, Polyurethane Foam Dielectric Materials for Use in Radomes and Other Applications, General Plastics Manufacturing Company, Nov. 3, 2015, 9 pages.
Shang et al., Characterization of Dielectric Materials at WM-380 Band 500-750 GHz Using Three Broadband Measurement Techniques, 2024 103rd ARFTG Microwave Measurement Conference (ARFTG), Jun. 2024, 4 pages.
International Search Report and Written Opinion, prepared by the International Search Authority, PCT application No. PCT/US2025/33068, Sep. 10, 2025, pp. 1-13.

(56)         References Cited

OTHER PUBLICATIONS

Tsai et al. "Novel Broadband Transition for Rectangular Dielectric Waveguide to Planar Circuit Board at D Band," 2018 IEEE/MTT-S International Microwave Symposium—IMS, Philadelphia, PA, USA, 2018, pp. 386-389.

\* cited by examiner

RADIO FREQUENCY PROBE INCLUDING A DIELECTRIC WAVEGUIDE AND A CONDUCTING TRANSITION MEMBER HAVING AN END PORTION WITH ASSOCIATED PRONGS

CROSS-REFERENCE TO RELATED APPLICATIONS

This application claims the benefit of U.S. Provisional Patent Application No. 63/658,241, filed on Jun. 10, 2024 and entitled "Dielectric Waveguide RF Wafer Probe and Dielectric Waveguide Interconnect" and U.S. Provisional Patent Application No. 63/820,198, filed on Jun. 9, 2025 and entitled "Radio Frequency Probes". The complete disclosures of the above applications are hereby incorporated by reference for all purposes.

BACKGROUND

The present disclosure is directed to radio frequency (RF) probes for testing and measurement of wafers and other integrated circuits.

With the continuous demand for transferring more data, communication systems (wireless and fiber) are moving to higher frequencies to meet this need. New systems are being developed in the sub-terahertz frequency range, nominally 100 GHz to 1 THz. A problem is the testing and measurement of components, such as the integrated circuits (ICs), used in these systems. Specifically, integrated circuits require special electrical probes that can contact the planar wafers on which they are fabricated. These probes are called "wafer probes." The wafer probe is connected to test equipment to perform measurements of the IC using interconnects, such as coaxial cable or metallic waveguide. The primary function of the wafer probe is to transition the interconnect from the test equipment to a set of planar contact "fingers" that can contact the planar device under test (DUT) on the IC. A key part of the system is a probe station that holds the IC wafer under test and the wafer probe(s). The wafer probes are generally able to move in multiple axes to allow optimal contact to the IC wafer.

Below 200 GHz there are many wafer probes available that use coaxial cable interconnects to interface with test equipment, such as a Vector Network Analyzer (VNA) and other equipment. The coaxial cable is generally flexible, which allows movement of the wafer probes on the probe station. However, a roadblock for measuring devices above 200 GHz is that the coaxial cables have extremely high loss, and their connectors thereof resonate, causing significant distortion of the signals being measured. One solution is to use metallic waveguide as the interconnect between the wafer probe and the test equipment, due to the low loss thereof. The present state of the art for wafer probing above 220 GHz is to use metallic waveguides connected to a special waveguide input wafer probe.

However, there are several problems with this current state-of-the-art. First, the ridged waveguide interconnect between the test equipment and the waveguide input wafer probe is inflexible and thus requires that both the wafer probe and some of the test equipment share a common platform. This is cumbersome and can impose physical constraints on probe positioning. Additionally, the waveguide input wafer probes are still using the methods developed in the early 1990's of being constructed using precision machined parts and exotic fabricated probe tips. The process is expensive, and thus many of the above probes cost over $10,000.

What is desired, therefore, are radio frequency probes that include a flexible connection to test equipment using low-loss materials and that use cost effective manufacturing techniques, such as 3D printing, casting molding, etc., to fabricate the probes.

SUMMARY OF THE INVENTION

To meet the above needs, the RF probes of the present disclosure include a dielectric waveguide, which eliminates most of the external conductors used by present solutions. Dielectric waveguide has not been used to create a probe with a (CPW) mode that is compatible with contacting and measuring planar devices. Note that a dielectric waveguide is not to be confused with other interconnect technologies that use a dielectric as a substrate, such as microstrip, CPW, strip-line, etc., These interconnect types assume propagation of signal in a mode that is called "transverse electromagnetic" (TEM) or "quasi-TEM", and these modes they have no cutoff frequency and thus can support both direct current (DC) and time varying alternating current (AC) signals. These modes can also support DC voltage between the various conductors. In contrast, a dielectric waveguide supports modes of propagation, such as the TE11 mode, which have a cutoff frequency and thus have a lower boundary of operating frequency and cannot support a DC voltage or current.

A novel feature of RF probes of the present disclosure is to embed a conducting transition region into the dielectric waveguide that can convert a dielectric waveguide mode into a planar mode such as CPW (or slot line mode) that is suitable for contacting a planar DUT on an IC or other surfaces. The RF probes of the present disclosure use new design techniques in that the waveguide is primarily dielectric and not metal aside from a conducting bottom and internal conducting ridge or wire. The transition transforms both the characteristic impedance and the electric field pattern of the dielectric waveguide to those of a planar transmission line, such as CPW or slot line. Once the CPW mode has been established conductive (i.e., metal) extensions called "fingers" can be added to contact metal pads on planar devices, such as integrated circuits (ICs) on semiconductor wafers. Embedding conductors to enable a transition from a dielectric waveguide to create a RF probe is believed to be new and nonobvious over the prior art.

BRIEF DESCRIPTION OF THE SEVERAL DRAWINGS

For a better understanding of the invention, and to show how the same may be carried into effect, reference will now be made, by way of example to the accompanying drawings, where like features are denoted by the same reference labels throughout the detail description of the drawings, and in which.

DETAILED DESCRIPTION OF PREFERRED EMBODIMENTS

Figure 1:
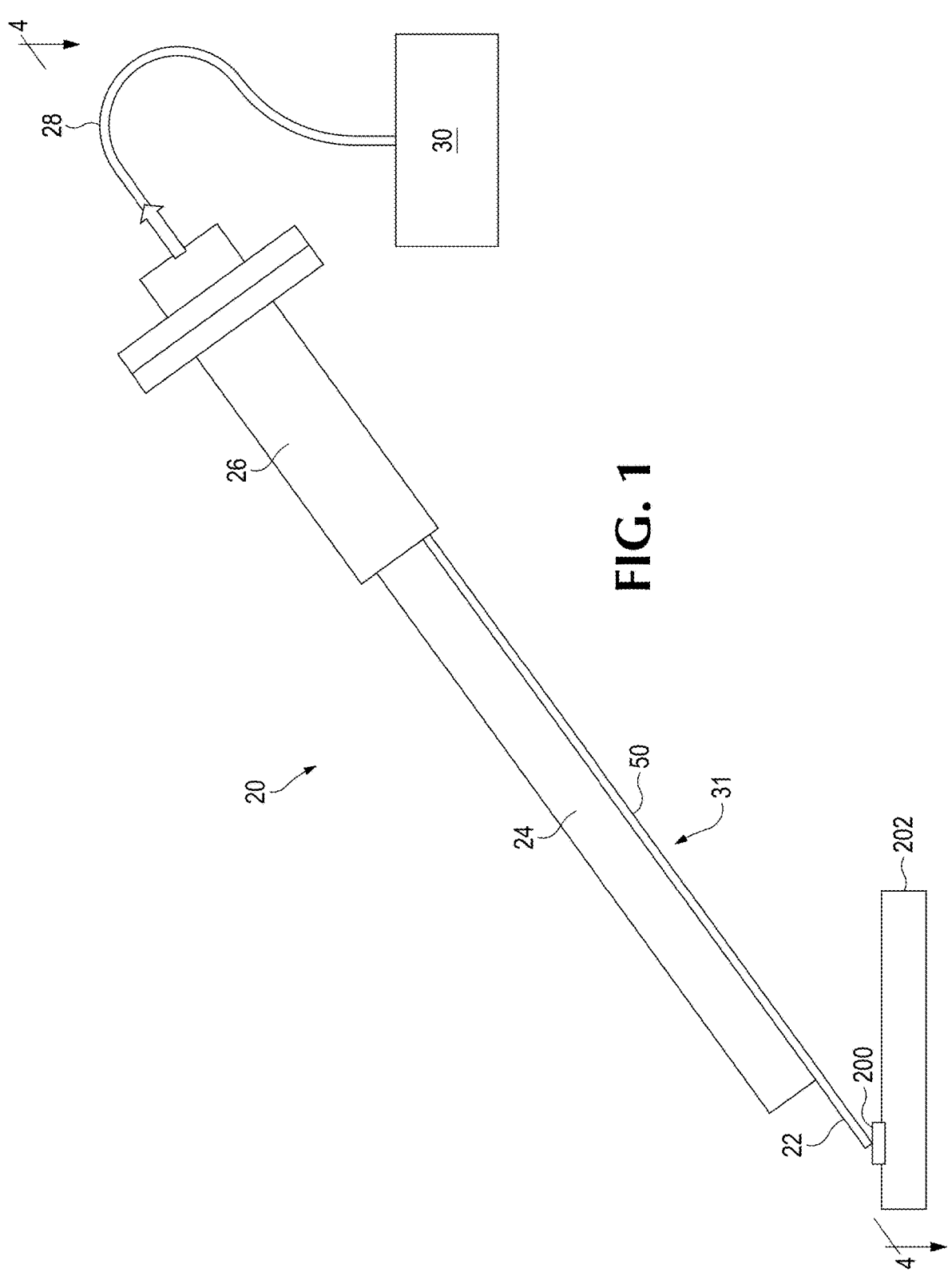
FIG. 1 shows a side view of an example of a probe assembly testing a device-under-test (DUT) on a wafer.
Figure 2:
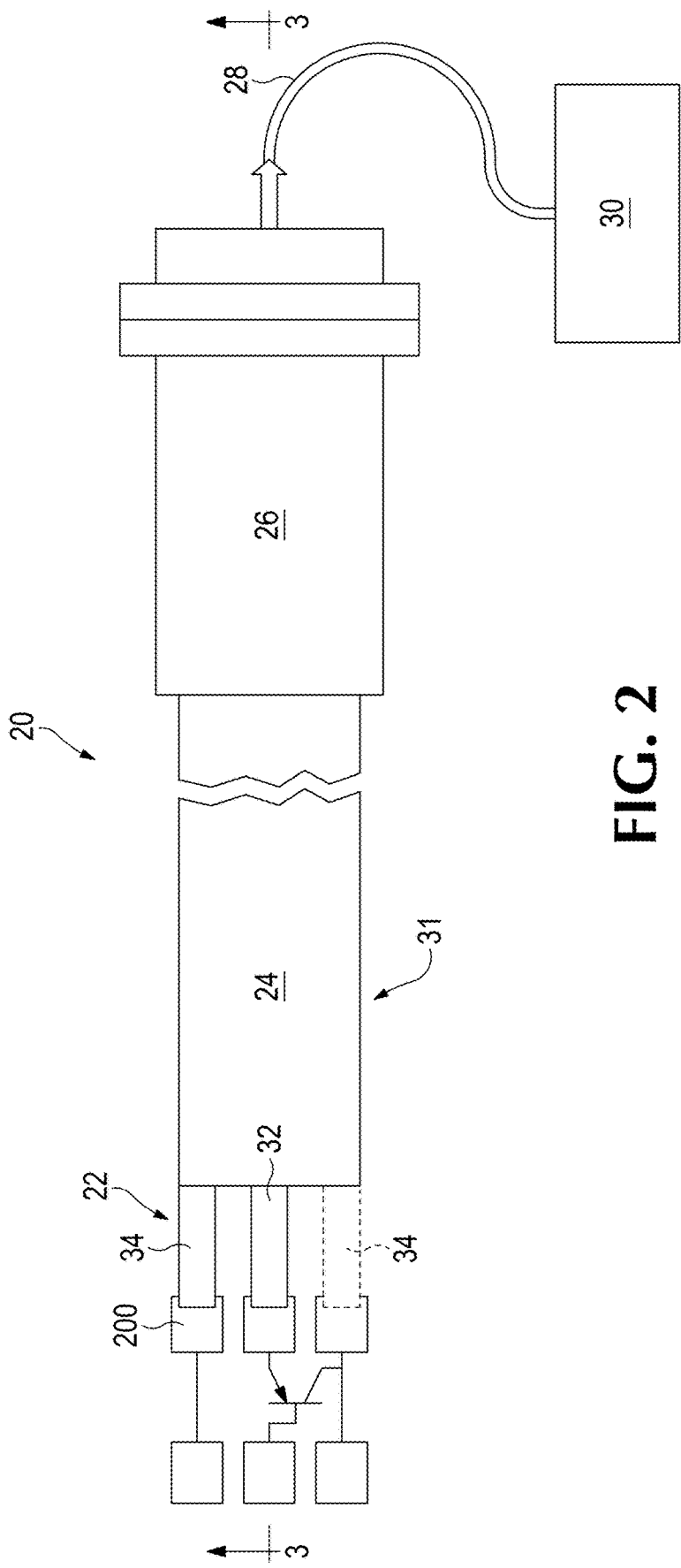
FIG. 2 shows a top view of the probe assembly of FIG. 1.

Referring to FIG. 1, a probe assembly 20 testing a device-under-test (DUT) or other test structure 200 on a wafer or other similar device 202 is shown. The probe assembly includes fingers 22, a dielectric waveguide 24, a hollow metal waveguide 26, interconnect(s) 28, and testing instrumentation or testing equipment 30. The fingers, the dielectric waveguide, and the metal waveguide may collectively be referred to as "RF probe 31." As shown in FIGS. 2 and 4, fingers 22 include includes a signal finger 32 spaced from one or more ground fingers 34. When fingers 22 includes two ground fingers 34, the signal finger is disposed between the ground fingers. The dielectric waveguide is solid and may be made of any suitable materials, such as high-density polyethylene (HDPE), acrylonitrile butadiene styrene (ABS), fluoropolymer polytetrafluoroethylene, etc. Dielectric waveguide 24 includes opposed longitudinal end portions 36 and 38, as shown in FIGS. 3-4.

Figure 3:
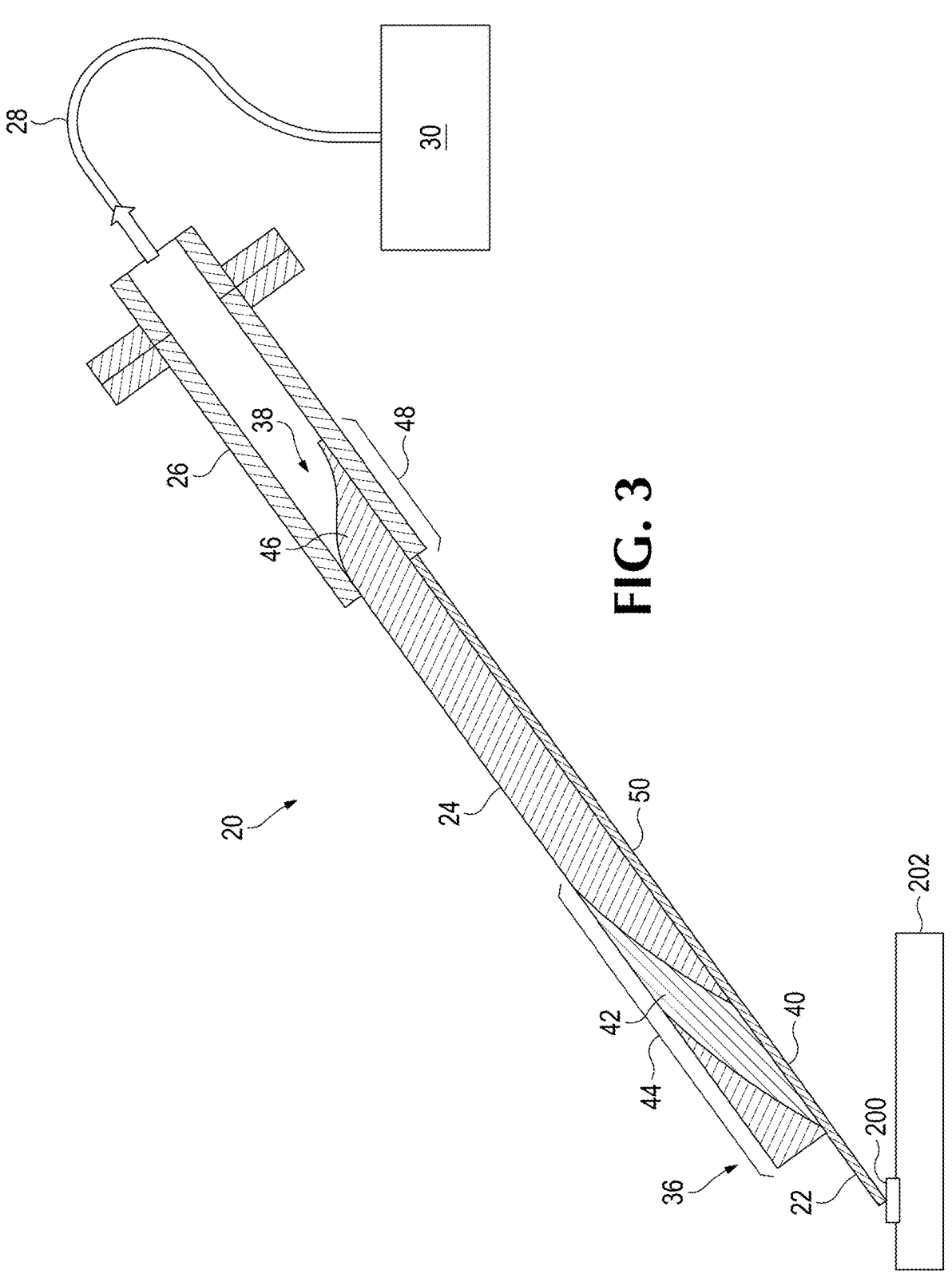
FIG. 3 shows a sectional view of the probe assembly of FIG. 1 taken along lines 3-3 in FIG. 2.
Figure 4:
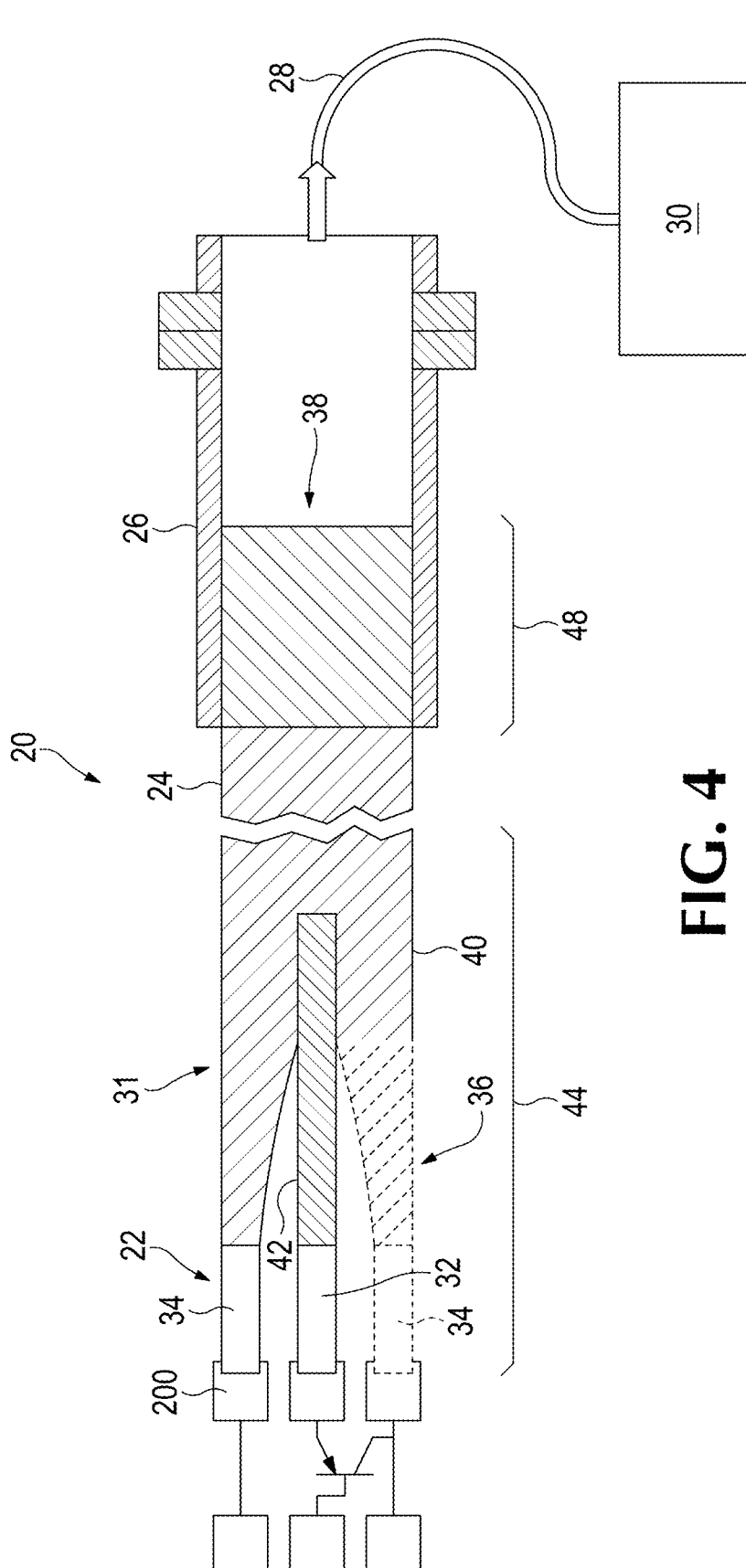
FIG. 4 shows a sectional view of the probe assembly of FIG. 1 taken along lines 4-4 in FIG. 1.

Referring to FIGS. 3-4, a conducting ground member 40 and a conducting transition member 42 are received (or embedded) in end portion 36 of the dielectric waveguide. When two ground fingers are used, area 44 that includes end portion 36, the conducting ground member, and the conducting transition member may be described as a "transition between a dielectric waveguide and a coplanar waveguide (CPW)." When only one ground finger is used, area 44 may be described as the "transition between a dielectric waveguide and a slot line." As shown in FIG. 3, end portion 38 of the dielectric waveguide is received in the metal waveguide and includes a transition portion 46. Area 48 that includes end portion 38 and the portion of the metal waveguide that receives end portion 38 may be described as the "transition between the metal waveguide and the dielectric waveguide."

In the example described above, the dielectric waveguide also includes a bottom conductive layer 50 that is connected to, or formed with, conducting ground member 40, as shown in FIG. 3. Other examples of the probe assembly may not include a bottom conductive layer or may alternatively, or additionally, include a top conductive layer. Additionally, although probe assembly 20 is shown to include fingers 22, other examples of the probe assembly may exclude the fingers. Moreover, although the dielectric waveguide is shown to include a single or core dielectric substrate, other examples of the dielectric waveguide may include one or more outer dielectric substrates attached to one or more surfaces of the primary or core substrate (e.g., top, bottom, and/or side surfaces), as further discussed below. Furthermore, probe assembly 20 may include additional components, such as components to move probe 31 in three axes, components to support and secure the probe in selected positions, etc. Examples of additional components may be found in U.S. Pat. No. 7,876,114, which is hereby incorporated by reference for all purposes. Additionally, although the dielectric waveguide is shown to be shaped as a rectangular prism, the dielectric waveguide may be any suitable shapes, including any suitable rectilinear or curvilinear shapes. For example, the dielectric waveguide may alternatively curve downward toward the DUT in FIGS. 1-4. Moreover, although the probe assembly of FIGS. 1-4 is shown to include particular components, other examples of the probe assembly may exclude one or more of those components. For example, other examples of the probe assembly may exclude the metal waveguide.

Figure 5:
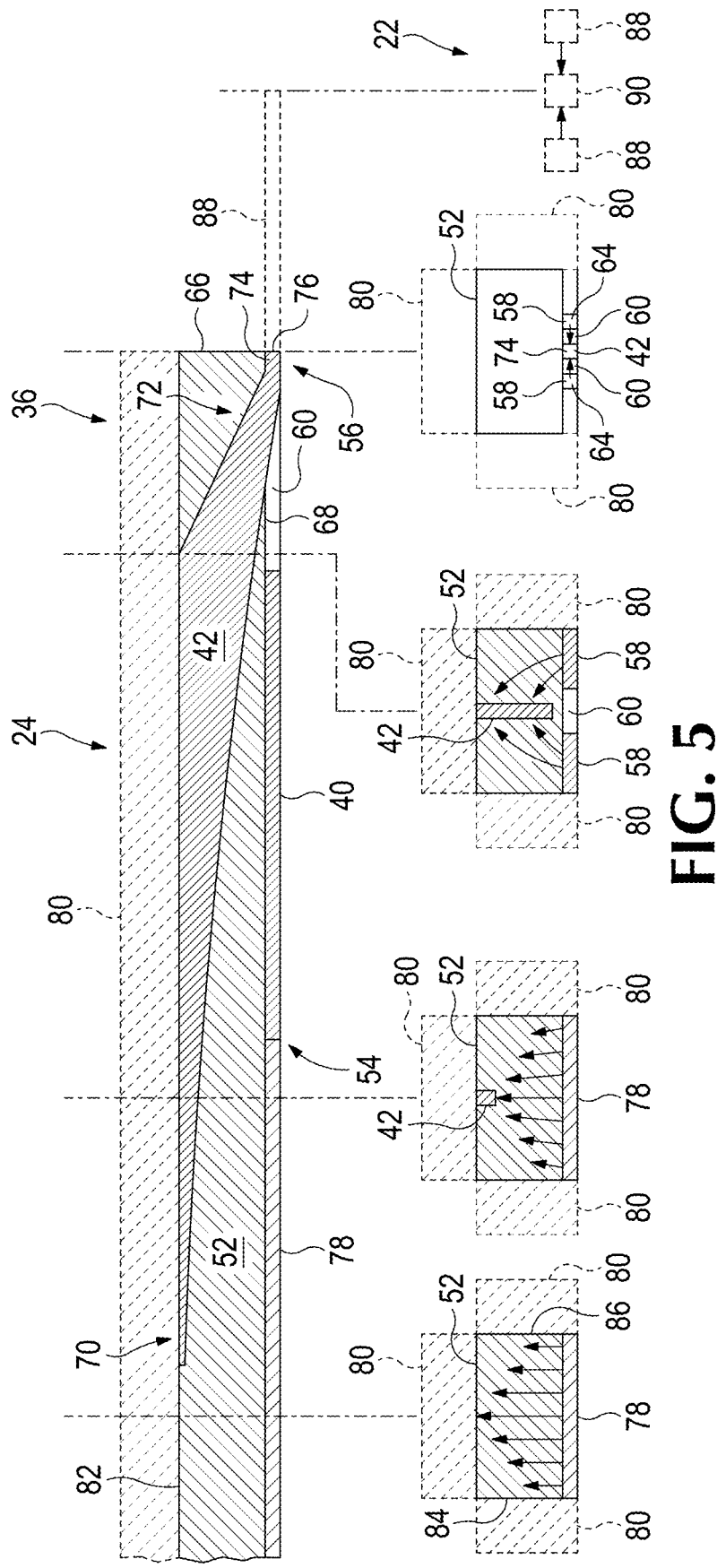
FIG. 5 shows various views of an example of a dielectric waveguide, a conducting transition member, and fingers of the probe assembly of FIG. 1.

Referring to FIG. 5, various views of an example of dielectric waveguide 24, conducting ground member 40 and conducting transition member 42 are shown. The upper drawing on FIG. 5 is a side sectional view and the lower drawings include sectional views (first three drawings from left) from that side view and end views (the remaining drawings or two drawings from right). The end view on the rightmost lower part of FIG. 5 has been enlarged to improved readability. Dielectric waveguide 24 includes a core dielectric substrate 52. Conducting ground member 40 is received or embedded in end portion 36 of the core dielectric substrate. The conducting ground member includes longitudinal end portions 54 and 56. End portion 56 includes one or more prongs or ground prongs 58. When there are two ground prongs as shown in FIG. 5, those prongs are spaced from each other to define a gap 60 therebetween. Suitable materials for the conducting ground member include brass, beryllium copper, nickel, copper, gold, etc. Gap 60 may exclude any dielectric material other than air. Alternatively, core dielectric substrate 52 may be shaped to fill part but not all of the gap so that the ground and signal prongs are still accessible.

Ends 64 of prongs 58 are flush with and/or contact end surface 66 and/or bottom surface 68 of end portion 36 of the core dielectric substrate. Alternatively, end 64 extends beyond end surface 66 and/or bottom surface 68 of the core dielectric substrate. In other words, prongs 58 are electrically accessible from end surface 66 and/or bottom surface 68. Conducting transition member 42 is also received or embedded in end portion 36 of the core dielectric substrate.

The conducting transition member includes longitudinal end portions 70 and 72. End portion 72 includes a prong or signal prong 74 that is disposed within gap 60 between prongs 58 and spaced from prongs 58. Suitable materials for conducting transition member 42 include brass, beryllium copper, nickel, copper, gold, etc. End 76 of prong 74 is flush with and/or contacts end surface 66 and/or bottom surface 68 of end portion 36 of the core dielectric substrate. Alternatively, end 76 of prong 74 extends beyond the end surface and/or the bottom surface of end portion 36 of the core dielectric substrate. In other words, prong 74 is electrically accessible from end surface 66 and/or bottom surface 68. The lower sectional views of FIG. 5 show the electrical field arrangement with the depicted series of arrows.

In the example shown in FIG. 5, a conductive layer 78 is attached to bottom surface 68 and adjacent to and attached to, or formed with, end portion 54 of conducting ground member 40 (which is also attached to the bottom surface as discussed above). Conductive layer 78 may be made of any suitable materials, such as brass, beryllium copper, nickel, copper, gold, etc. The conductive layer may span the entire length and width of the bottom surface of the core dielectric substrate, or may span less than all the length and/or width. When the dielectric waveguide includes outer dielectric layers (as discussed below), the conductive layer may span all the length and/or width of one or more of those layers.

In some examples, dielectric waveguide may include one or more outer dielectric layers 80 that are attached to one or more surfaces of the core dielectric substrate. For example, as shown in FIG. 5, an outer dielectric layer 80 may be attached to a top surface 82 and side surfaces 84 and 86 of core dielectric substrate 52. Other examples may include outer dielectric layers being attached only on the top surface, only on the side surfaces, etc. In the dielectric waveguide, the core dielectric substrate generally has a higher dielectric constant than the outer dielectric layers that surround the core dielectric substrate. The outer dielectric layers are different materials from the core dielectric substrate and may be the same or different from each other. For example, the core dielectric substrate may be made of high-density polyethylene (HDPE), acrylonitrile butadiene styrene (ABS), fluoropolymer polytetrafluoroethylene (PTFE), polytetrafluoroethylene (e.g., Teflon®), etc., and the outer dielectric layers may be made of air, air-filled Polytetrafluoroethylene (i.e., open or closed cell PTFE foam), etc. Additionally, ground fingers 88 may be attached to, or formed with, prongs 58, and a signal finger 90 may be attached to, or formed with, prong 74.

Figure 6:
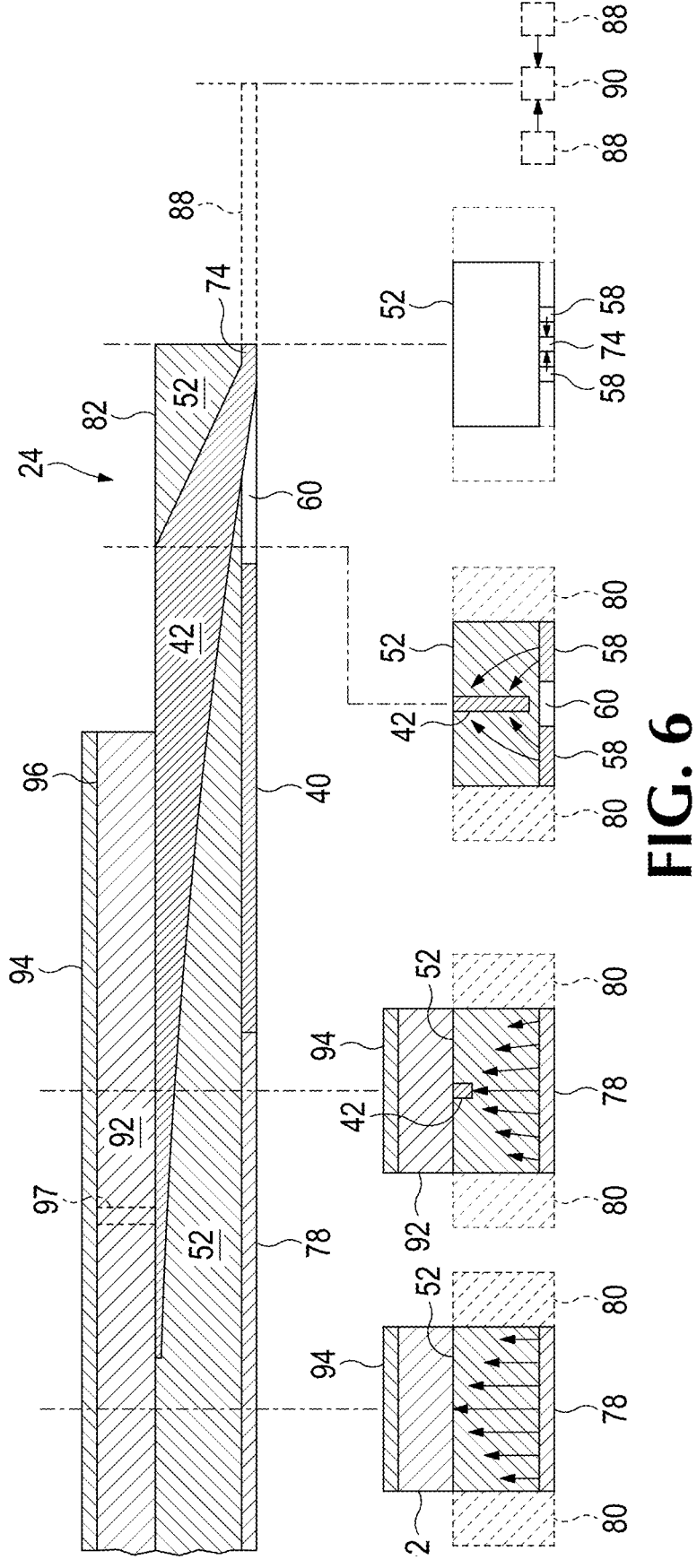
FIG. 6 shows various views of another example of a dielectric waveguide, a conducting transition member, and fingers of the probe assembly of FIG. 1.

Referring to FIG. 6, various views of another example of dielectric waveguide 24, conducting ground member 40 and conducting transition member 42 are shown. The upper drawing on FIG. 6 is a side sectional view and the lower drawings include sectional views (first three drawings from left) from that side view and end views (remaining drawings or two drawings from right). The end view on the rightmost lower part of FIG. 6 has been enlarged to improved readability. Unlike the example of FIG. 5, a dielectric spacer 92 is attached to one or more surfaces of the core dielectric substrate. In the example shown in FIG. 6, dielectric spacer 92 is attached to top surface 82 of core dielectric substrate 52. However, the dielectric spacer may, alternatively, be attached to two or more surfaces of the core dielectric substrate. The dielectric spacer may be made of any suitable materials, such as high-density polyethylene (HDPE), acrylonitrile butadiene styrene (ABS), fluoropolymer polytetrafluoroethylene (PTFE), polytetrafluoroethylene (e.g., Teflon®), air-filled Polytetrafluoroethylene (i.e., open or closed cell PTFE foam), etc. Similar to the example in FIG. 5, outer dielectric layers 80 may be attached to side surfaces of the core dielectric substrate. In some examples, the conducting transition member may be connected to the conductive shield through one or more vias 97.

Additionally, a conductive shield 94 may be attached to a surface 96 of the dielectric spacer opposite the core dielectric substrate, as shown in FIG. 6. In other words, the dielectric spacer is disposed between the core dielectric substrate and the conductive shield. The conductive shield may be made of any suitable materials, such as beryllium copper, nickel, copper, gold, etc. The conductive shield may span the entire length and width of the bottom surface, or may span less than all the length and/or width. In the example shown in FIG. 6, the conductive shield spans the entire width but not the entire length of the top surface of the dielectric spacer. When the dielectric waveguide includes outer dielectric layers (as discussed below), the conductive layer may span all the length and/or width of one or more of those layers. By making the electrical thickness of dielectric spacer 92 (between conductive shield 94 and surface 82 of core dielectric substrate 52) a quarter wavelength at the midband frequency of operation, the short circuit boundary condition of conductive shield 94 is transformed to "look like" an open circuit boundary condition at surface 82 of the core dielectric substrate 52. This shields the dielectric waveguide from external objects that can alter the RF waves travelling in the dielectric waveguide.

Figure 7:
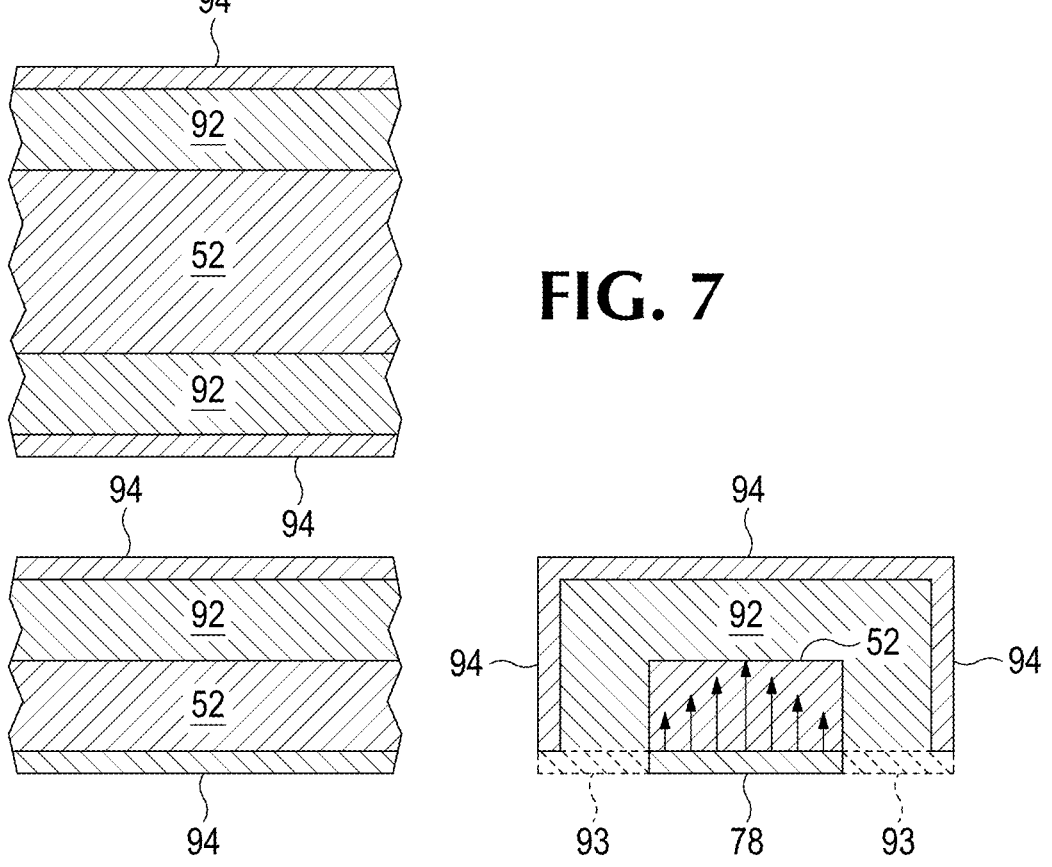
FIG. 7 shows various views of an example of a dielectric waveguide.

Referring to FIG. 7, various views of another example of a dielectric waveguide of the present disclosure is shown. The upper drawing is a top partial sectional view, the lower left drawing is a side partial sectional view, and the lower right drawing is an end view. Unlike the example of FIG. 6, FIG. 7 shows a dielectric spacer 92 attached to the top and side surfaces of the core dielectric surface. In other words, the dielectric spacer surrounds or encloses the core dielectric substrate on three sides. A conductive layer 78 is attached to the bottom surface of the core dielectric substrate may, in some examples, span all of the width of the dielectric spacer as shown at 93. In this embodiment, the dielectric spacer(s) have an electrical thickness of a quarter wavelength of the midband frequency of operation.

Figure 8:
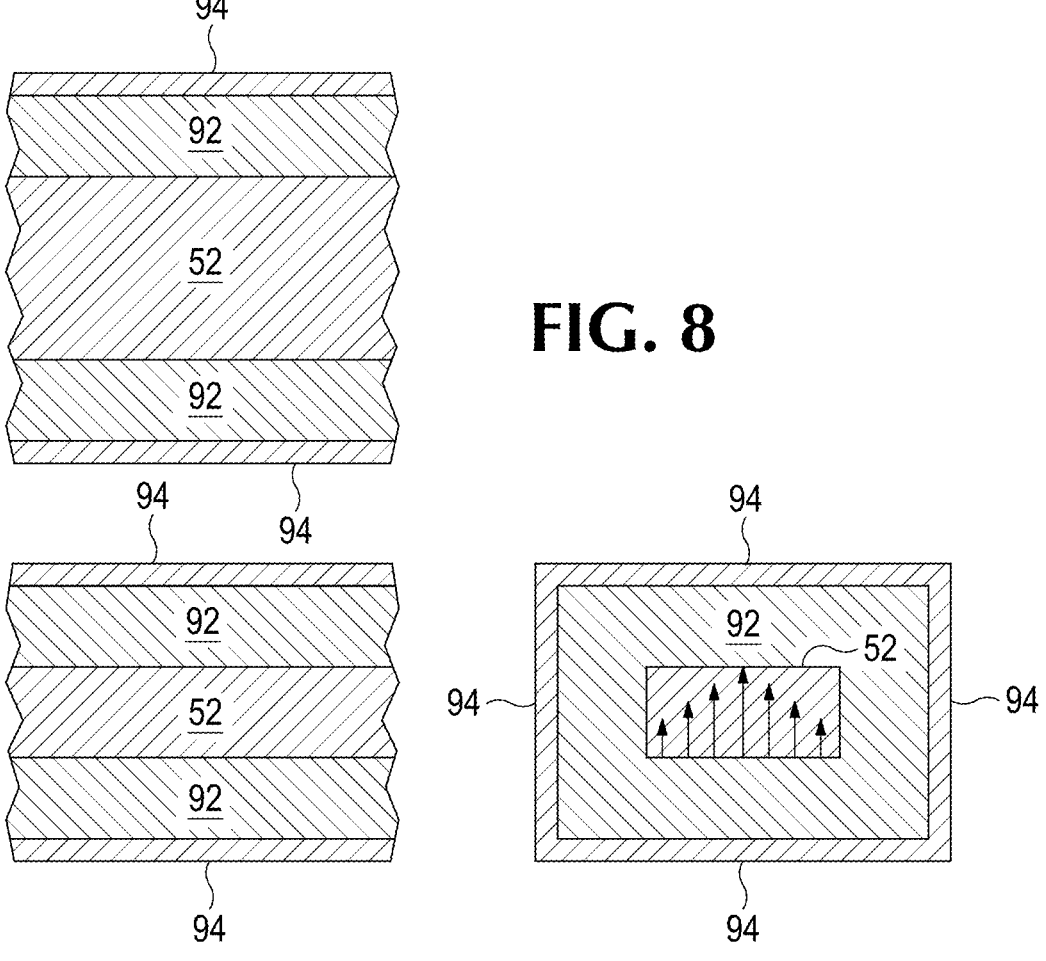
FIG. 8 shows various views of another example of a dielectric waveguide.

Referring to FIG. 8, various views of another example of a dielectric waveguide of the present disclosure is shown. Unlike the examples of FIGS. 6-7, FIG. 8 shows a dielectric spacer 92 attached to the top, bottom, and side surfaces of the core dielectric surface. In other words, the dielectric spacer completely surrounds or encloses the core dielectric substrate on all sides. The end views of FIGS. 6-8 show the electrical field arrangement with the depicted series of arrows.

Figure 9:
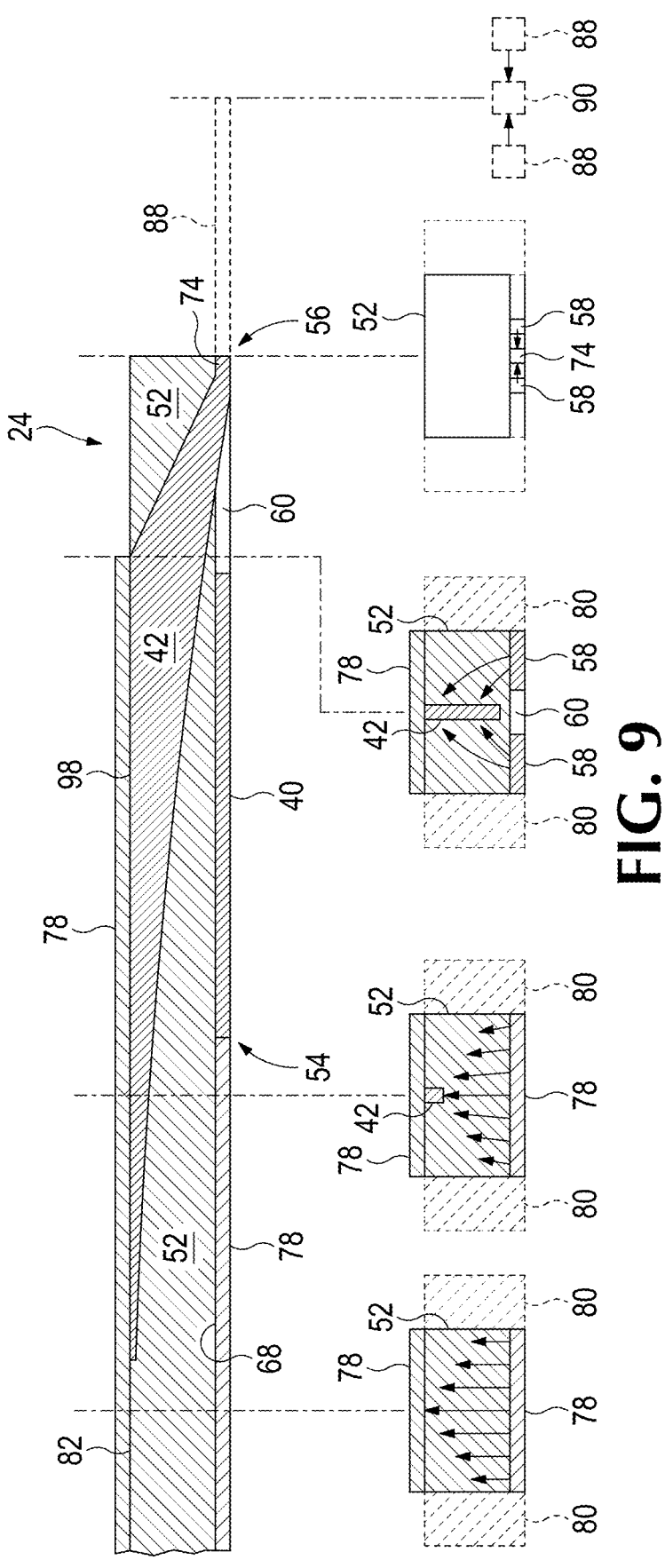
FIG. 9 shows various views of a further example of a dielectric waveguide, a conducting transition member, and fingers of the probe assembly of FIG. 1.

Referring to FIG. 9, various views of another example of dielectric waveguide 24, conducting ground member 40 and conducting transition member 42 are shown. The upper drawing on FIG. 9 is a side sectional view and the lower drawings include sectional views (first three drawings from left) from that side view and end views (remaining drawings or two drawings from right). The end view on the rightmost lower part of FIG. 9 has been enlarged to improved readability. Unlike the examples of FIGS. 5-6, a conductive layer 78 is attached to bottom surface 68 and top surface 82. The conductive layer that is attached to bottom surface 68 is also attached to, or formed with, and contacts end portion 54 of conducting ground member 40 (which is also attached to an adjacent portion of the bottom surface). The conductive layer that is attached to top surface 82 is attached to, or formed with, and contacts a top portion 98 of conducting transition member 42. The lower sectional views of FIG. 9 show the electrical field arrangement with the depicted series of arrows. Similar to the examples in FIGS. 5-6, outer dielectric layers 80 may be attached to side surfaces of the core dielectric substrate and the conductive layers may extend to the opposed surfaces of those layers.

Figure 10:
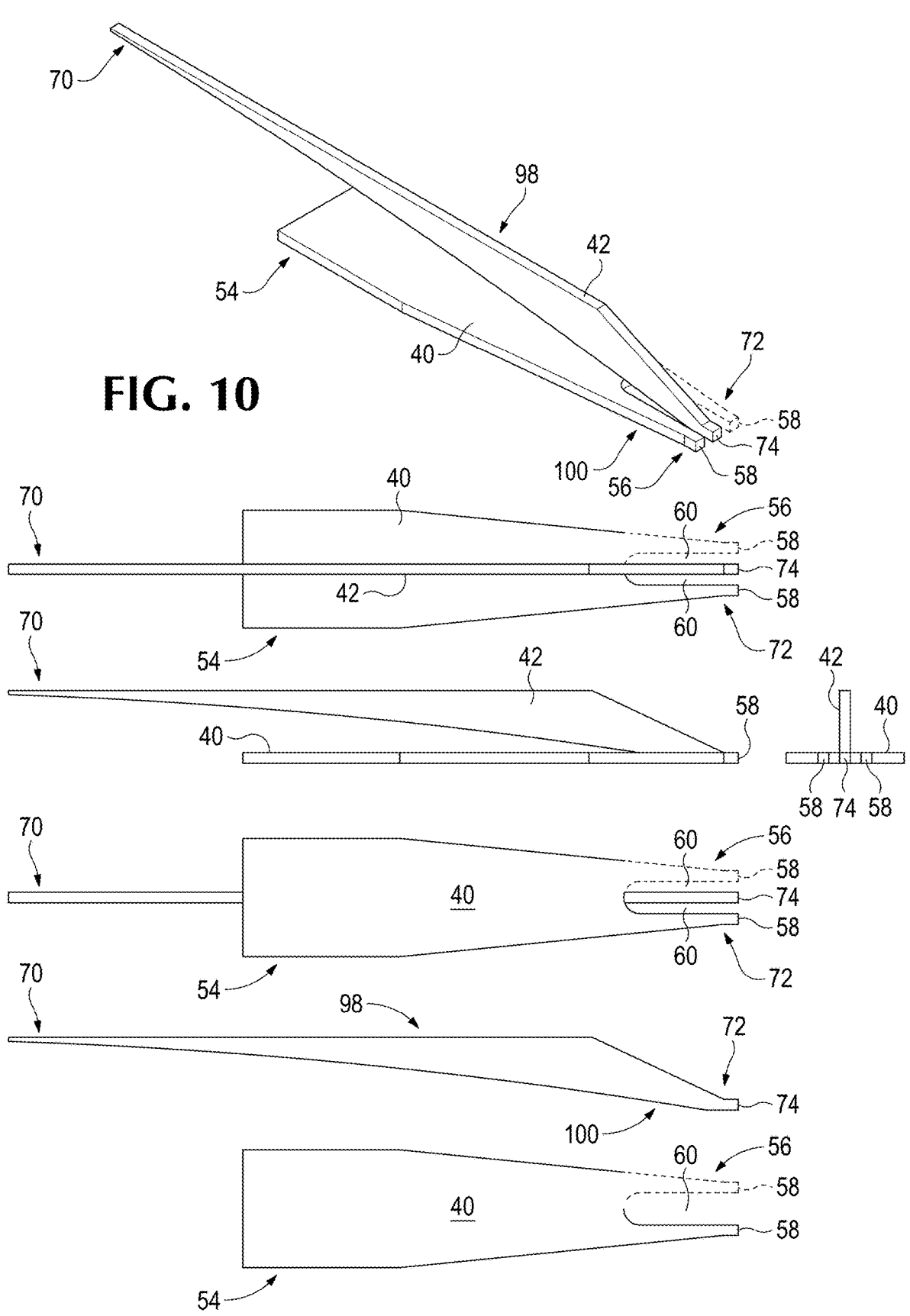
FIG. 10 shows various views of an example of a conducting transition member and a conducting ground member of the probe assembly of FIG. 1.
Figure 11:
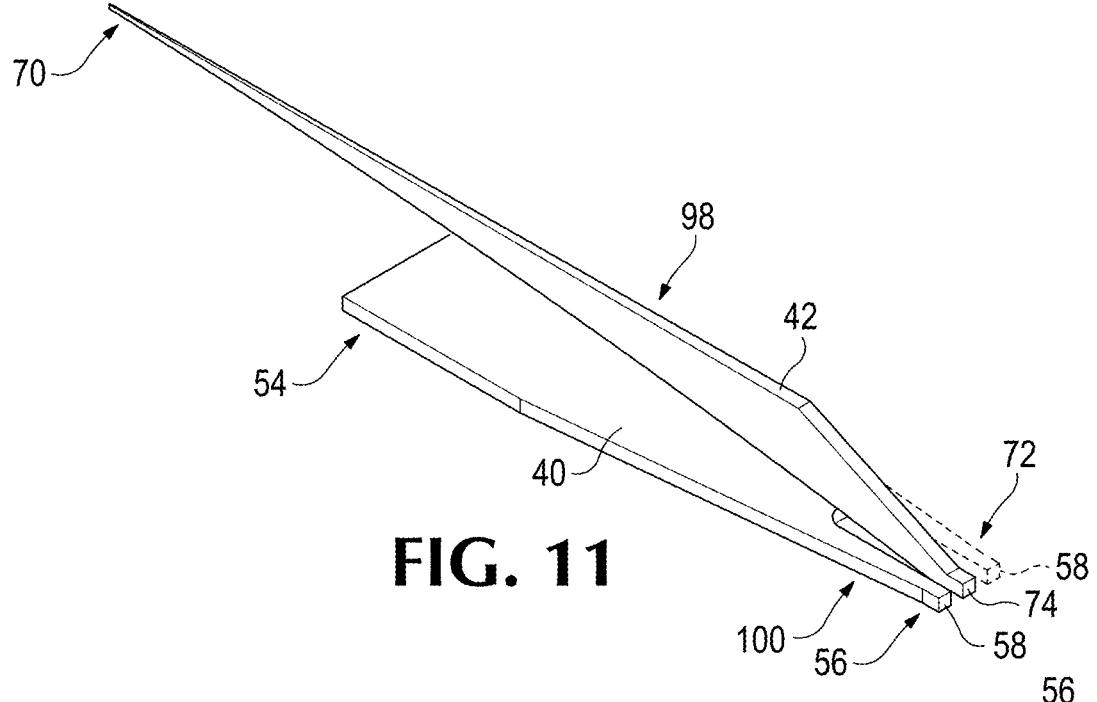
FIG. 11 shows an isometric view of the conducting transition member and conducting ground member of FIG. 10 showing an alternative example of the conducting transition member.
Figure 12:
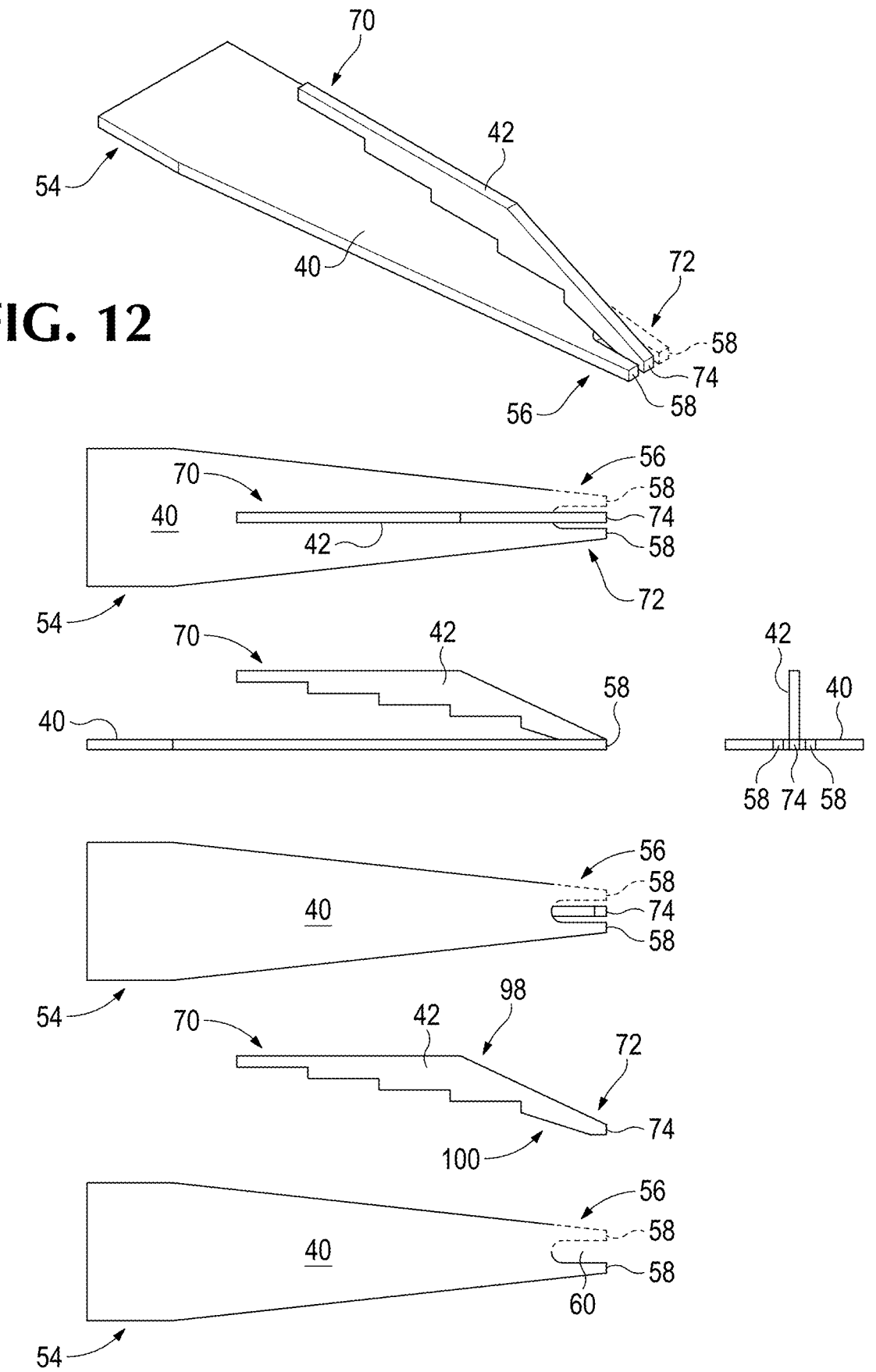
FIG. 12 shows various of another example of a conducting transition member and a conducting ground member of the probe assembly of FIG. 1.

Referring to FIGS. 10-12, various views of two examples of conducting ground member 40 and conducting transition member 42 are shown. In FIG. 10, the top drawing is an isometric view of the conducting ground member and the conducting transition member as set and/or secured in the core dielectric substrate. The second drawing from the top in FIG. 10 is a top view, the third drawing from the top and on the left in FIG. 10 is a side view, and the third drawing from the top and on the right in FIG. 10 is an end view. The fourth drawing from the top in FIG. 10 is a bottom view and the fifth drawing from the top in FIG. 10 is an exploded view. As previously discussed, end portion 56 of conducting ground member 40 includes one or more prongs or ground prongs 58. When there are two ground prongs as shown in FIGS. 10 and 12, those prongs are spaced from each other to define a gap 60 therebetween. In the example shown in FIG. 10, conducting ground member 40 is planar and is generally wedge shaped with end portion 56 being narrower than end portion 54. However, other examples of conducting ground member 40 may include other shapes, such as rectangular, etc. Some of the other shapes may not be planar. For example, FIG. 11 shows a variant in which the thickness of end portion 70 of conducting transition member 42 is tapered.

As previously discussed, conducting transition member 42 includes longitudinal end portions 70 and 72. End portion 72 includes a prong or signal prong 74 that is disposed within gap 60 between prongs 58 and spaced from prongs 58. In the example shown in FIGS. 10-12, conducting transition member 42 is planar and is oriented perpendicular to the conducting ground member (as best shown in the end view of FIG. 10). Additionally, the conducting transition member is generally triangular shaped in FIGS. 10-11 with top portion 98 being much longer than bottom portion 100. Alternatively, the conducting transition member may be triangular with a ridged or stepped bottom, as shown in FIG. 12. The conducting transition member is narrow and high in end portion 70 and descends and gets thicker toward end portion 72.

The conducting transition member converts a dielectric waveguide mode (i.e., TE11) characteristic impedance to a lower impedance appropriate for the DUT, typically 50 ohms but other values are possible. The dielectric waveguide characteristic impedance is determined by the dielectric constant of the dielectric waveguide substrate. For high-density polyethylene (HDPE) this characteristic impedance has been estimated to be about 300 ohms from measurement. This impedance transformation can be done using methods such as a cosine taper, linear taper, exponential taper, stepped transformer, etc. This process also transitions the dielectric waveguide mode electric field pattern into a ridge waveguide type mode. The final step is to convert the ridge waveguide mode into a ridge-trough mode and finally the desired planar CPW mode or slot line mode between that ground prongs 58 and signal prong 74.

Figure 13:
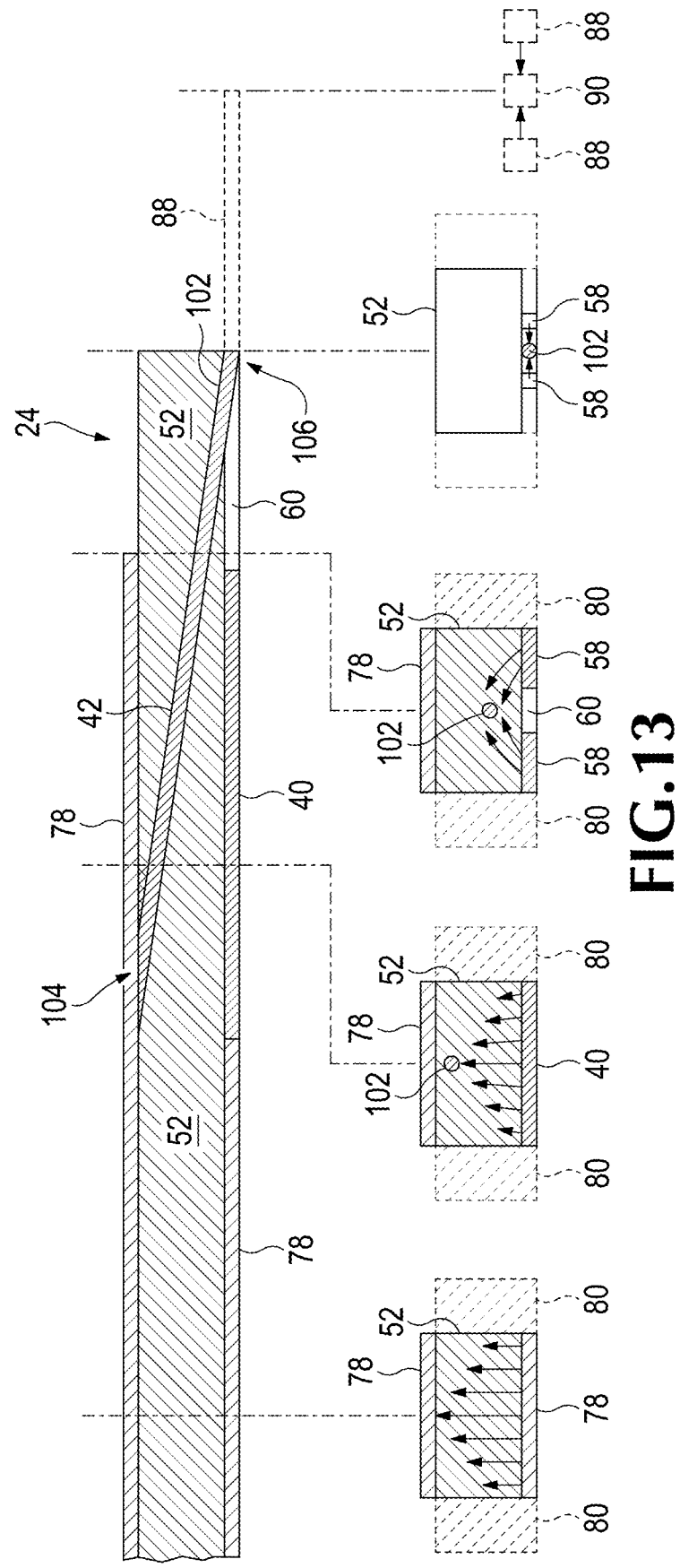
FIG. 13 shows the various views of yet another example of a dielectric waveguide, a conducting transition member, and fingers of the probe assembly of FIG. 1.

Referring to FIG. 13, various views of another example of dielectric waveguide 24, conducting ground member 40 and conducting transition member 42 are shown. The upper drawing on FIG. 13 is a side sectional view and the lower drawings include sectional views (first three drawings from left) from that side view and end views (remaining drawings or two drawings from right). The end view on the rightmost lower part of FIG. 13 has been enlarged to improved readability. Unlike the previous examples in FIGS. 5-6 and 9, conducting transition member 42 is in the form of a conducting wire 102 having longitudinal end portions 104 and 106. End portion 104 is attached or connected to the top surface of the core dielectric substrate and the top conductive layer and end portion 106 is attached or connected to the bottom surface and the end surface of the core dielectric substrate and the bottom conductive layer. The conducting wire may also be used in the previous examples discussed above, such as the examples of FIGS. 5-9. For example, when the conducting wire is used in the example of FIG. 6, one or more vias 97 may be used to electrically connect the conductive shield to the conducting wire.

Although the examples shown in FIGS. 5-13 show a core dielectric substrate that has a square or rectangular cross-section with a top surface, bottom surface, and opposed side surfaces, other examples of the core dielectric substrate may have a circular or elliptical cross-section. When the core dielectric substrate has a circular or elliptical cross section, the dielectric spacers and conductive layers may be attached to top, bottom, and side portions of the outer surface of the core dielectric substrate.

Figure 14:
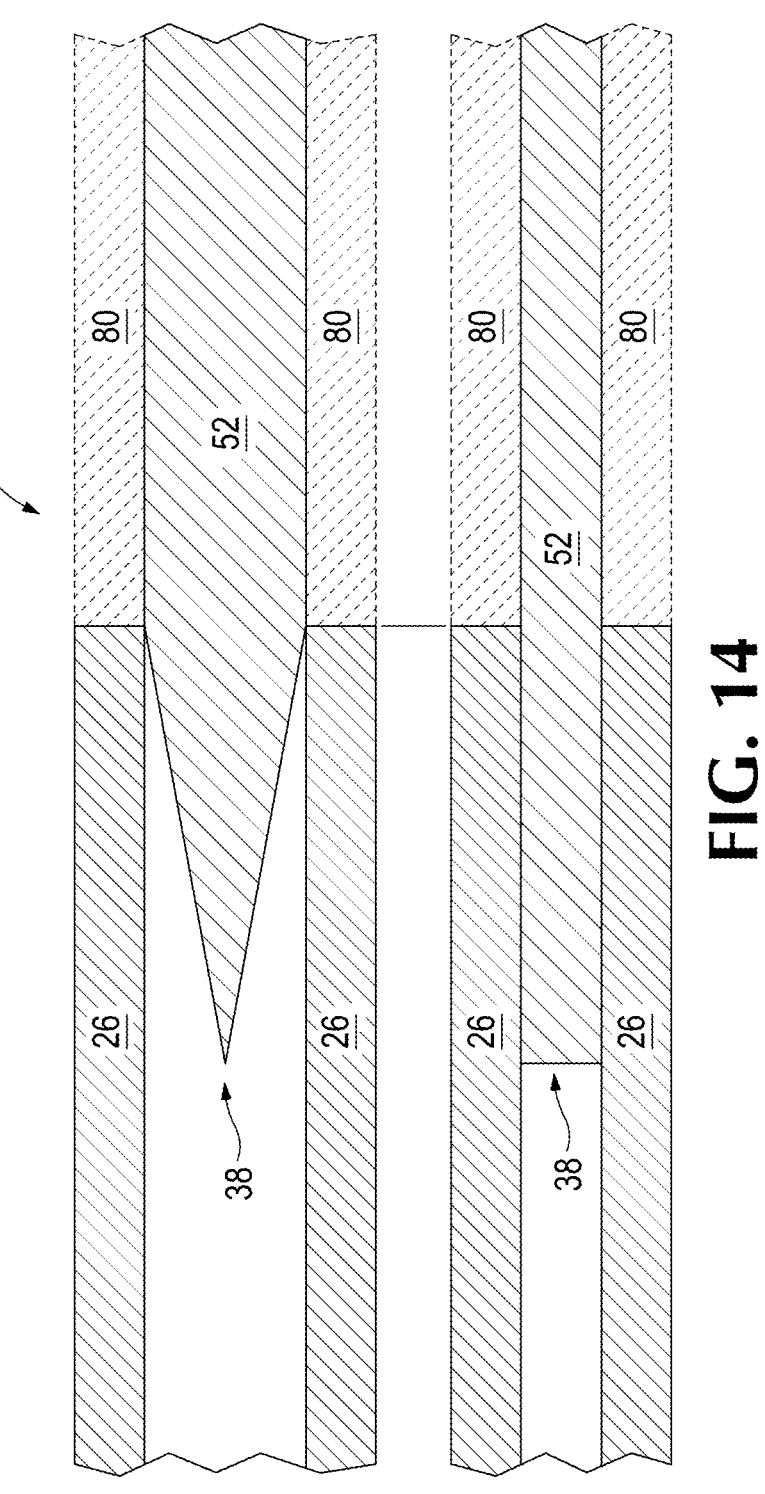
FIG. 14 shows various sectional views of the probe assembly of FIG. 1 showing an example of a transition portion of the dielectric waveguide received in the metal waveguide.
Figure 15:
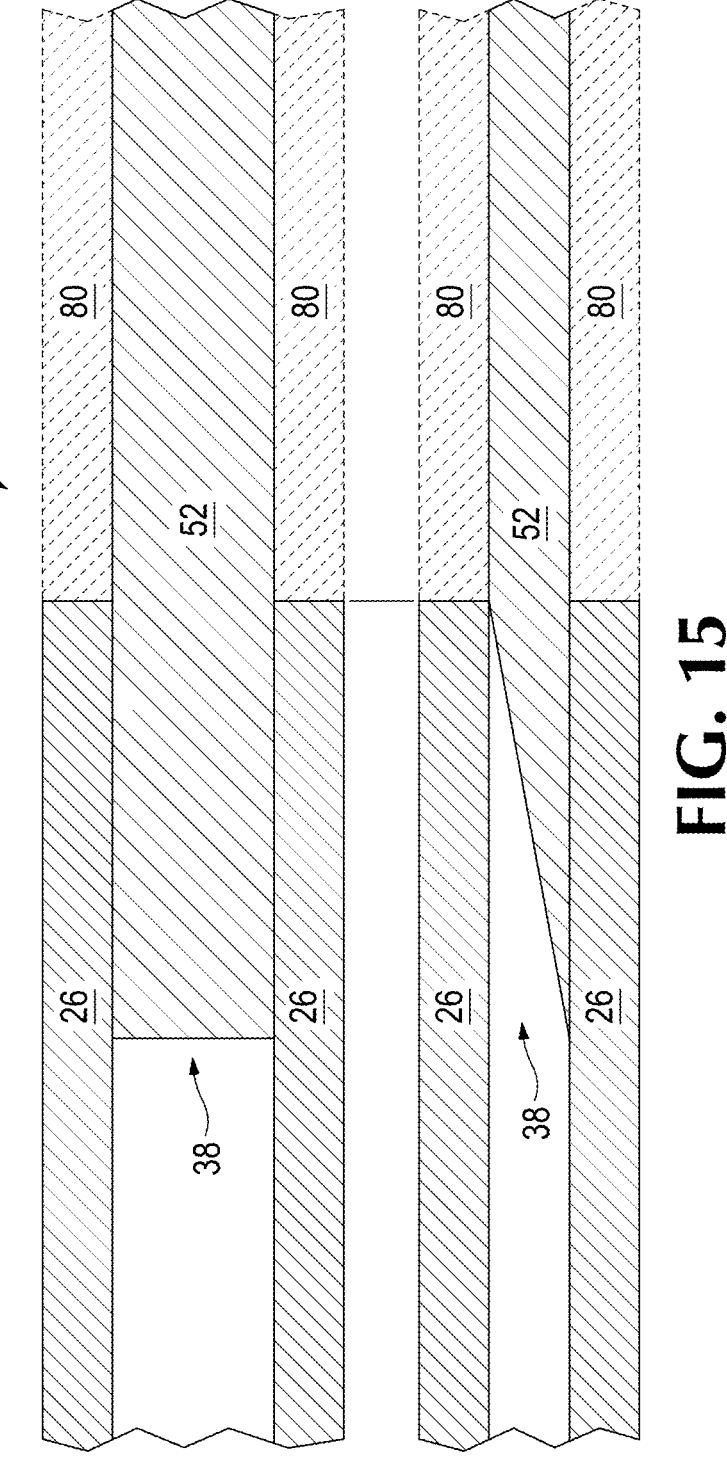
FIG. 15 shows various sectional views of the probe assembly of FIG. 1 showing another example of a transition portion of the dielectric waveguide received in the metal waveguide.
Figure 16:
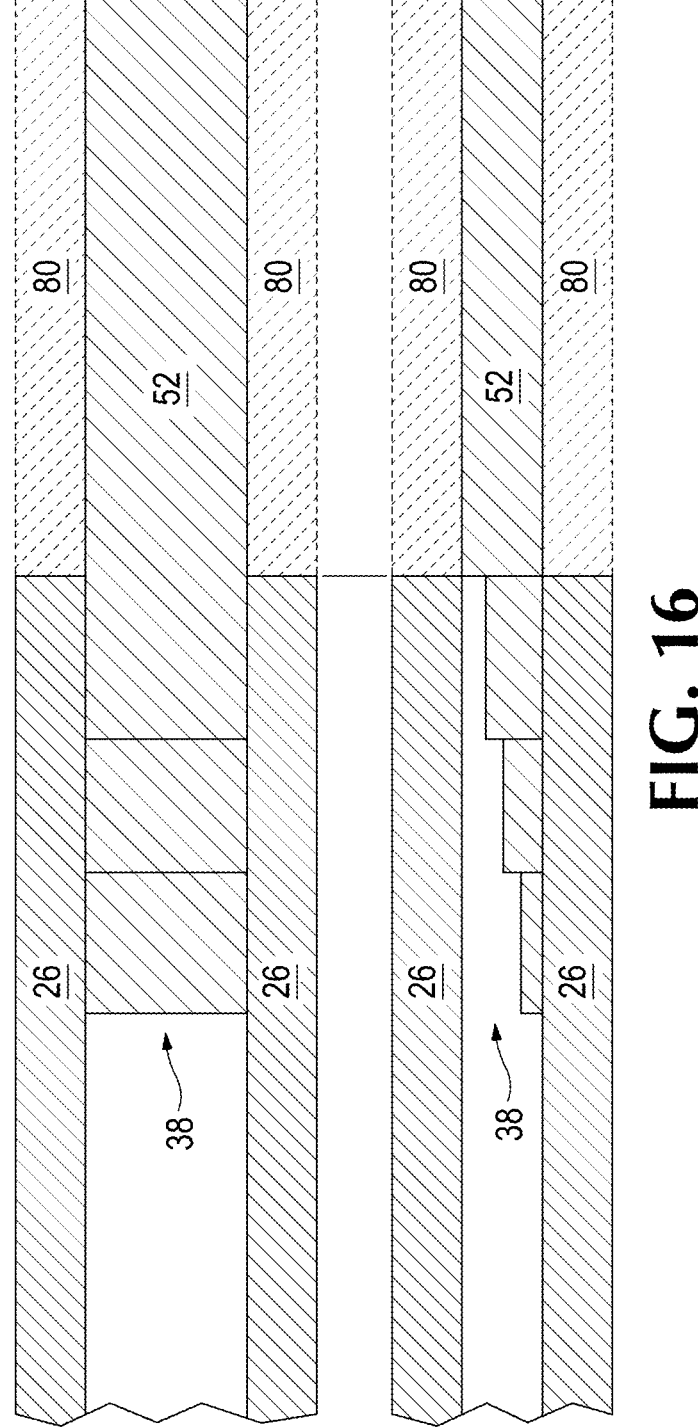
FIG. 16 various sectional views of the probe assembly of FIG. 1 showing a further example of a transition portion of the dielectric waveguide received in the metal waveguide.

Referring to FIGS. 14-16, various partial sectional views showing different examples of area 48 that includes end portion 38 of the core dielectric substrate and the portion of the metal waveguide that receives end portion 38. The upper drawing of each of FIGS. 14-16 shows a top view and the lower drawing shows a side view. End portion 38 may be tapered along one or more sides such that the amount of core dielectric substrate decreases as the end portion extends into the metal waveguide. For example, the end portion may be shaped as a triangular prism that has its two triangular faces oriented vertically as shown in FIG. 14, or may be wedge or ramp shaped with the rectangular faces oriented vertically as shown in FIG. 15. Alternatively, the end portion may include two or more rectangular prisms that decrease in height as the end portion extends into the metal waveguide. End portion 38 may alternatively, or additionally, include one or more other suitable shapes that taper or decrease in volume as that end portion extends into the metal waveguide.

The probe assemblies as described above provide various advantages over prior art probe assemblies. For example, the probe assembly uses a dielectric waveguide to convey signals from test equipment to a device under test (DUT), which offers cost savings over conventional solutions that use precisely machined metal components and interconnects fabricated on substrates. Additionally, the dielectric waveguide is flexible and thus the probe assemblies do not require various physical constraints associated with prior art probe assemblies. Moreover, the probe assemblies have a transition region to convert the electric field mode in the dielectric waveguide to a planar mode (slot line or coplanar) that is compatible with measuring planar devices. Furthermore, the probe can supply a bias to the DUT. For example, a voltage ($V_{bias}$) can be applied between the two conductive layers to allow a voltage between the signal and ground probes.

Example Features: This section describes additional aspects and features of the probe assemblies, presented without limitation as a series of paragraphs, some or all of which may be alphanumerically designated for clarity and efficiency. Each of these paragraphs can be combined with one or more other paragraphs, and/or with disclosure from elsewhere in this application in any suitable manner. Some of the paragraphs below expressly refer to and further limit other paragraphs, providing, without limitation, examples of some of the suitable combinations.

A1. A radio frequency (RF) probe, comprising:
a dielectric waveguide having opposed first and second longitudinal end portions;
a planar conducting ground member being received in the first end portion of the dielectric waveguide, the conducting ground member having an end portion with at least a first prong; and
a conducting transition member received in the first end portion of the dielectric waveguide and spaced from the planar conducting ground member, the conducting transition member having an end portion that includes a second prong spaced from the first prong.

A2. The RF probe of paragraph A1, wherein the end portion of the conducting ground member includes the first prong and a third prong spaced from the first prong defining a gap therebetween.

A3. The RF probe of paragraph A2, wherein the second prong is disposed within the gap between first and third prongs, the second prong being spaced from the first prong and from the second prong.

A4. The RF probe of paragraph A3, further comprising a first finger attached to, or formed with, the first prong, a second finger attached to, or formed with, the second prong, and a third finger attached to, or formed with, the third prong, the first, second, and third fingers being external to the dielectric waveguide.

A5. The RF probe of any of paragraphs A1-A4, wherein the dielectric wave guide includes opposed top and bottom surfaces and further comprising a first conductive layer attached to the bottom surface of the dielectric waveguide.

A6. The RF probe of paragraph A5, wherein the first conductive layer extends from the metal waveguide to the conducting ground member.

A7. The RF probe of any of paragraphs A5-A6, further comprising a second conductive layer attached to the top surface of the dielectric waveguide.

A8. The RF probe of paragraph A7, wherein the second conductive layer extends from the metal waveguide to the conducting transition member.

A9. The RF probe of any of paragraphs A1-A8, further comprising a dielectric spacer attached to one or more surfaces of the dielectric waveguide, the dielectric spacer being made of one or more materials different from the dielectric waveguide.

A9.5 The RF probe of any of paragraphs A1-A9, wherein the dielectric spacer is electrically a quarter wavelength thick.

A9.75 The RF probe of any of paragraphs A1-A9.5, wherein the dielectric spacer is electrically a quarter wavelength thick at the midband of frequency of operation.

A10. The RF probe of any of paragraphs A9-A9.75, wherein the dielectric spacer is attached to a top surface of the dielectric waveguide.

A11. The RF probe of any of paragraphs A9-A10, wherein the dielectric spacer is attached to opposed side surfaces of the dielectric waveguide.

A12. The RF probe of any of paragraphs A9-A11, wherein the dielectric spacer is attached to a bottom surface of the dielectric waveguide.

A13. The RF probe of any of paragraphs A9-A12, further comprising a conductive shield attached to a surface of the dielectric spacer opposed from the dielectric waveguide.

A14. The RF probe of any of paragraphs A9-A14, further comprising a conductive layer attached to a surface of the dielectric waveguide that does not include the dielectric spacer.

A15. The RF probe of paragraph A14, wherein the conductive layer extends from the metal waveguide to one of the conducting transition member of the conducting ground member.

A16. The RF probe of any of paragraphs A1-A15 wherein the conducting transition member is planar and wherein the conducting ground member is in a first plane and the conducting transition member is in a second plane that is perpendicular to the first plane.

A17. The RF probe of any of paragraphs A1-A16, wherein the dielectric waveguide includes opposed top and bottom surfaces, and wherein the conducting transition member includes opposed third and fourth longitudinal end portions, the third end portion being adjacent to and contacting the top surface and spaced from the bottom surface and the fourth end portion being adjacent to and contacting the bottom surface.

A18. The RF probe of paragraph A17, wherein the conducting ground member extends along the bottom surface.

A19. The RF probe of any of paragraphs A1-A18, wherein the conducting transition member is a metal plate.

A19.5 The RF probe of any of paragraphs A1-A18, wherein the conducting transition member is a rectangular prism or a triangular prism.

A19.75 The RF probe of any of paragraphs A1-A19, wherein the conducting transition member is planar.

A20. The RF probe of any of paragraphs A1-A18, wherein the conducting transition member is a conducting wire.

A21. The RF probe of any of paragraphs A1-A20, further comprising a first finger attached to, or formed with, the first prong and a second finger attached to, or formed with, the second prong, the first and second fingers being external to the dielectric waveguide.

A22. The RF probe of any of paragraphs A1-A21, wherein the dielectric waveguide includes a dielectric core with a first outer dielectric attached to one side of the dielectric core and a second outer dielectric attached to the opposite side of the dielectric core, the first and second outer dielectrics being made of one or more materials different from the dielectric core.

A23. The RF probe of paragraph A22, wherein the first outer dielectric is made of one or more materials different from the second outer dielectric.

A24. The RF probe of any of paragraphs A22-A23, wherein the first outer dielectric is the same one or more materials as the second outer dielectric.

A25. The RF probe of any of paragraphs A1-A24, further comprising a hollow metal waveguide, wherein second end portion of the dielectric waveguide is received in the metal waveguide.

A26. The RF probe of paragraph A25, wherein the first end portion of the dielectric waveguide tapers as the second end portion extends into the metal waveguide.

A27. The RF probe of any of paragraphs A25-A26, wherein the second end portion tapers along one or more sides.

A28. The RF probe of any of paragraphs A25-A27, wherein the second end portion has the shape of a triangular prism.

A29. The RF probe of any of paragraphs A25-A28, wherein the second end portion has the shape of two or more adjacent rectangular prisms having heights that decrease as the first end portion extends into the metal waveguide.

A30. The RF probe of any of paragraphs A1-A29, wherein the conducting ground member is a metal plate.

It will be appreciated that the invention is not restricted to the particular embodiment that has been described, and that variations may be made therein without departing from the scope of the invention as defined in the appending claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

What is claimed is:

1. A radio frequency (RF) probe, comprising:
a dielectric waveguide having opposed first and second longitudinal end portions;
a planar conducting ground member being received in the first end portion of the dielectric waveguide, the conducting ground member having an end portion with at least a first prong; and
a conducting transition member received in the first end portion of the dielectric waveguide and spaced from the planar conducting ground member, the conducting transition member having an end portion that includes a second prong spaced from the first prong.

2. The RF probe of claim 1, wherein the end portion of the conducting ground member includes the first prong and a third prong spaced from the first prong defining a gap therebetween.

3. The RF probe of claim 2, wherein the second prong is disposed within the gap between first and third prongs, the second prong being spaced from the first prong and from the second prong.

4. The RF probe of claim 3 further comprising a first finger attached to, or formed with, the first prong, a second finger attached to, or formed with, the second prong, and a third finger attached to, or formed with, the third prong, the first, second, and third fingers being external to the dielectric waveguide.

5. The RF probe of claim 1, wherein the dielectric wave guide includes opposed top and bottom surfaces and further comprising a first conductive layer attached to the bottom surface of the dielectric waveguide and contacting the conducting ground member.

6. The RF probe of claim 5, further comprising a second conductive layer attached to the top surface of the dielectric waveguide and contacting the conducting transition member.

7. The RF probe of claim 1, further comprising a dielectric spacer attached to one or more surfaces of the dielectric waveguide, the dielectric spacer being made of one or more materials different from the dielectric waveguide.

8. The RF probe of claim 7, further comprising a conductive shield attached to a surface of the dielectric spacer opposed from the dielectric waveguide.

9. The RF probe of claim 8, further comprising a conductive layer attached to a surface of the dielectric waveguide that does not include the dielectric spacer.

10. The RF probe of claim 9, further comprising at least one via in the dielectric spacer to electrically connect the conductive shield to the conducting transition member.

11. The RF probe of claim 1, wherein the conducting transition member is planar and wherein the conducting ground member is in a first plane and the conducting transition member is in a second plane that is perpendicular to the first plane.

12. The RF probe of claim 1, wherein the conducting transition member is one of a metal plate or a conducting wire.

13. The RF probe of claim 1, wherein the dielectric waveguide includes a dielectric core with a first outer dielectric attached to one side of the dielectric core and a second outer dielectric attached to the opposite side of the dielectric core, the first and second outer dielectrics being made of one or more materials different from the dielectric core.

14. The RF probe of claim 1, further comprising a hollow metal waveguide, wherein second end portion of the dielectric waveguide is received in the metal waveguide.

15. The RF probe of claim 14, further comprising a conductive layer attached to a bottom surface of the dielectric waveguide, the conductive layer extending between the metal waveguide and the conducting ground member, the conductive layer contacting both the metal waveguide and the conducting ground member.

16. The RF probe of claim 15, wherein the second end portion of the dielectric waveguide tapers along one or more sides as the second end portion extends into the metal waveguide.

17. The RF probe of claim 16, wherein the second end portion has the shape of a triangular prism.

18. The RF probe of claim 16, wherein the second end portion has the shape of two or more adjacent rectangular prisms having heights that decrease as the first end portion extends into the metal waveguide.

19. A radio frequency (RF) probe, comprising:
a dielectric waveguide having opposed first and second longitudinal end portions, the second end portion of the dielectric waveguide being received in a metal waveguide;
a planar conducting ground member being received in the first end portion of the dielectric waveguide, the conducting ground member having an end portion with first and second prongs that are spaced from each other defining a gap therebetween; and
a conducting transition member received in the first end portion of the dielectric waveguide and spaced from the planar conducting ground member, the conducting transition member having an end portion that includes a third prong that is disposed within the gap between first and second prongs, the third prong being spaced from the first and second prongs.

20. The RF probe of claim 19, wherein the first end portion of the dielectric waveguide tapers along one or more sides as the second end portion extends into the metal waveguide.

* * * * *